United States Patent
White et al.

[19]

[11] Patent Number: 5,961,716
[45] Date of Patent: Oct. 5, 1999

[54] DIAMETER AND MELT MEASUREMENT METHOD USED IN AUTOMATICALLY CONTROLLED CRYSTAL GROWTH

[75] Inventors: Barton V. White; David J. Vickrey, both of Vancouver, Wash.

[73] Assignee: SEH America, Inc., Vancouver, Wash.

[21] Appl. No.: 08/990,534

[22] Filed: Dec. 15, 1997

[51] Int. Cl.[6] .................................................. C30B 15/26
[52] U.S. Cl. .............................. 117/14; 117/15; 117/201; 117/202
[58] Field of Search ................................ 117/14, 15, 201, 117/202

[56] References Cited

U.S. PATENT DOCUMENTS

| | | | |
|---|---|---|---|
| 3,998,598 | 12/1976 | Bonora | 117/202 |
| 4,350,557 | 9/1982 | Scholl et al. | 117/15 |
| 4,915,775 | 4/1990 | Katsuoka et al. | 117/202 |
| 5,138,179 | 8/1992 | Baba et al. | 117/15 |
| 5,170,061 | 12/1992 | Baba | 117/201 |
| 5,653,799 | 8/1997 | Fuerhoff | 117/201 |
| 5,656,078 | 8/1997 | Fuerhoff | 117/201 |
| 5,660,629 | 8/1997 | Shiraishi et al. | 117/201 |
| 5,665,159 | 9/1997 | Fuerhoff | 117/201 |
| 5,746,825 | 5/1998 | Von Ammon et al. | 117/14 |

OTHER PUBLICATIONS

"Monitoring Diameter Variation and Diameter Control Using Laser Beam and Image Processing in Czochralski Crystal Growth", IBM Technical Disclosure Bulletin, vol. 27, No. 10A, pp. 5777–5778 (Mar. 1985).
"The Basis of Automatic Diameter Control Utilizing "Bright Ring" Meniscus Reflections", T. G. Digges, Jr., Journal of Crystal Growth, vol. 29, pp. 326–328 (1975).

*Primary Examiner*—Felisa Garrett
*Attorney, Agent, or Firm*—Oliff & Berridge, PLC

[57] ABSTRACT

A CCD camera is used to measure the diameter of a growing crystal through optical recognition of the luminous ring at a crystal-melt interface. The result is an optical diameter control method and apparatus that eliminates the negative effects of orbit, melt-level and incorrect camera angle. The CCD camera is positioned such that it focuses on a full half of the circumference of the crystal as it is being grown. An automatic control system uses two points diametrically opposed on the crystal to measure the diameter, and a third point on the crystal closest to the camera to compute the melt level error. The automatic control system controls a crucible height and a crystal pull rate to optimize crystal diameter.

18 Claims, 7 Drawing Sheets

DIAMETER AND MELT MEASUREMENT METHOD USED IN AUTOMATICALLY CONTROLLED CRYSTAL GROWTH

BACKGROUND OF THE INVENTION

1. Field of Invention

This invention relates to an apparatus and a method for simultaneous crystal diameter measurement and melt level measurement to be used in an apparatus for growing crystals by the Czocharalski technique.

2. Description of Related Art

The Czocharalski method for crystal pulling is used to provide crystal rods for the semiconductor industry. The Czocharalski method involves melting high-purity semiconductor material in a crucible that is contained within a housing having a non-reactive atmosphere, and maintaining the temperature of the melt at a temperature just above the freezing point. A seed crystal is dipped at a particular orientation into the melt, and is then slowly raised from the melt so that liquid from the melt adheres to the withdrawing crystal seed. As the seed crystal with its adhering material is pulled away from the melt, an elongated crystal rod is formed. The diameter of the crystal rod is a function of many variables. For example, the temperature of the melt in the vicinity of the liquid-solid phase battery, i.e., adjacent to the interface between the melt and the growing rod, affects the rod diameter. The pulling rate and the melt level also affect rod diameter. Variations in rod diameter can result in excessive waste because the rod is then trimmed and cut to produce wafer slices of uniform physical dimensions.

The crystal rod is usually subjected to a grinding process before it is cut into wafers for making, for example, integrated circuit devices. In the grinding process, the outer peripheral surface of the silicon monocrystal rod is ground until a predetermined diameter is obtained. Because of purity concerns, the material ground from the silicon crystal rod cannot be reused. Accordingly, any removed material is considered waste, which results in undesirable increases in production cost. For example, for an unground bar 600 mm in length and 158 mm in diameter, if the diameter is reduced by one millimeter through grinding, the volume of the removed material is equal to 298 cubic centimeters. Accordingly, careful control of the crystal rod diameter is desirable.

Figure 1:
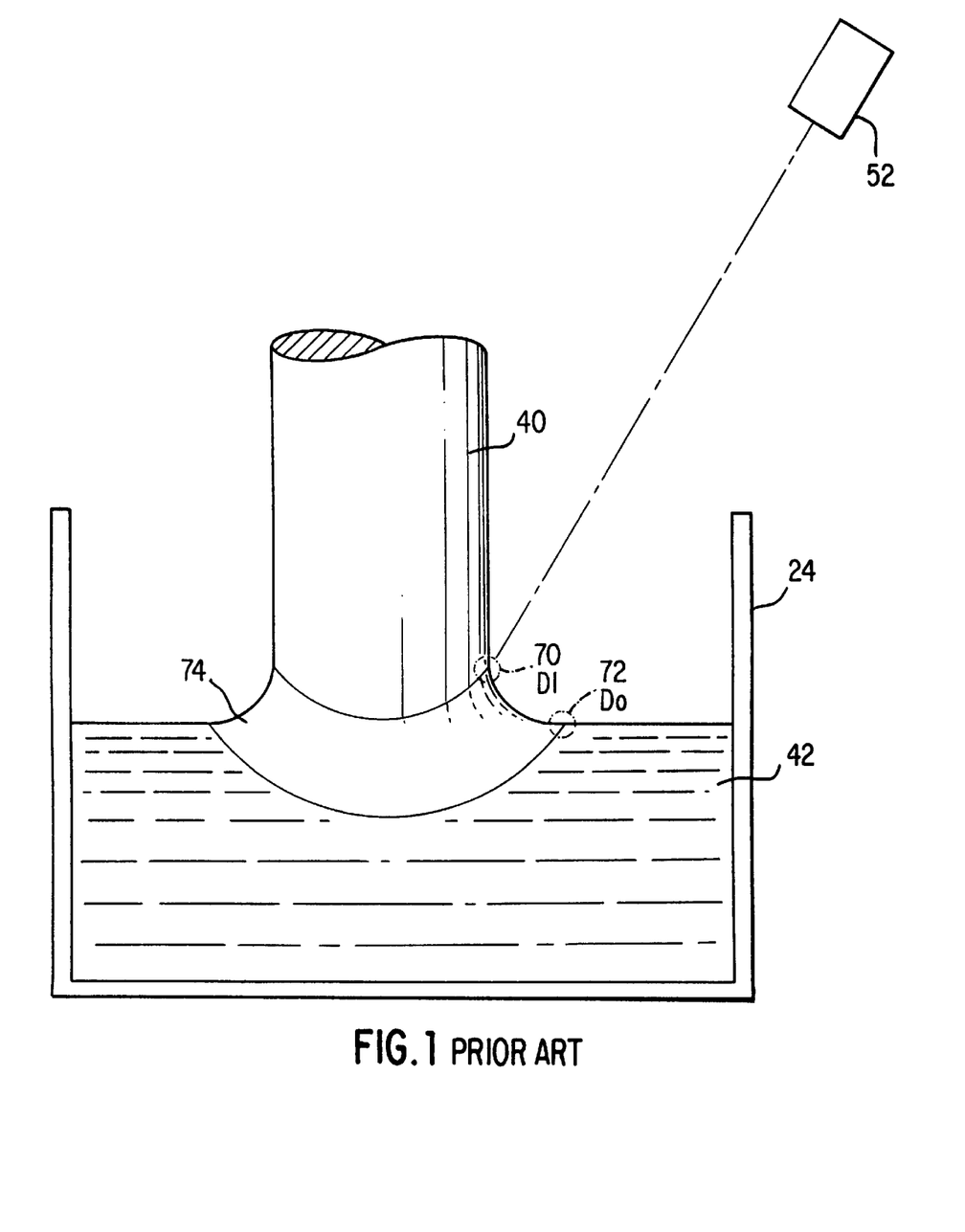
FIG. 1 is a schematic showing a conventional apparatus for controlling crystal diameters.

A conventional apparatus used for crystal diameter measurement is shown in FIG. 1. In FIG. 1, a luminous ring 74 is formed at an interface between the surface of a silicon melt 42, which is contained in a crucible 24, and the single silicon crystal 40 being pulled out of the melt 42. The luminous ring 74 is imaged to produce a video signal that is sent to an automatic control system. Imaging can be performed using a CCD camera 52, for example. A particular portion of the video signal such as an inner diameter $D_i$ 70 or an outer diameter $D_O$ 72 contained within the image, is detected and multiplied by pre-calculated constants to determine the diameter of the crystal 40 being grown. However, this diameter is calculated with the assumption that the center of the crystal 40 is at a known location. Thus, the automatic control system uses the location of the optically detected luminous ring 74 to calculate the distance from the detected point on the luminous ring 74 to a theoretical center of the crystal 40 in order to calculate a radius, which is then converted to a diameter.

Although this technique of converting points on the luminous ring 74 to compute a diameter is generally effective, there are several factors that can affect the accuracy of the diameter calculations. One key factor involves a phenomena known as orbit. As the crystal 40 grows, it is rotated around its longitudinal axis at a controlled rate. If the mass of the crystal 40 or the various mechanical parts used to hold and raise the crystal 40 from the melt 42 are not perfectly centered along the longitudinal axis of the crystal 40, the entire crystal 40 swings in a circular motion. The swinging motion is known as orbit. As the crystal 40 orbits in the melt 42, the luminous ring 74 moves, causing the automatic control system to incorrectly detect a change in diameter of the crystal 40, rather than sensing the orbit. The automatic control system then tries to compensate for the incorrectly perceived diameter change by adjusting temperature and/or pulling speed, resulting in a loss of diameter control.

Another phenomena affecting the diameter calculations when using the above-described method is the location of the melt level in the crucible 24. Because the CCD camera 52 is mounted above the melt level and uses an oblique angle to monitor the luminous ring 74, the melt level becomes critical. As depicted in FIG. 1, the CCD camera 52 is placed above the melt level at an oblique camera angle α, for example 22.5 degrees. If the melt level is in the theoretically predicted spot, a accurate diameter measurement can be calculated. If the melt level is higher or lower than theoretically calculated, the measured diameter of the crystal 40 is off by the difference between a theoretical and actual melt level multiplied by the tangent of the camera angle α and multiplied by two since the measured reading is the radius. In general, the error in diameter measurement due to melt level can be calculated as:

$$D_e = L_e \times \tan \alpha \times 2 \qquad \text{Equation 1}$$

where, $L_e$ is the error in melt level, measured along the longitudinal crystal axis, α is the camera angle, $D_e$ is the resulting error in diameter measurement.

The camera angle α plays another critical role in diameter measurement accuracy. The CCD camera 52 is calibrated to a known angle α relation to the viewing area. This angle α is used in the mathematical algorithms for calculating the diameter D of the crystal 40. If the CCD camera 52 is bumped or moved after calibration, the theoretical calculations are incorrect due to the predicted sensing location and the actual sensing location not being identical.

Conventional apparatuses for controlling crystal growth generally attempt to measure crystal diameter but do not compute melt level error. For example, U.S. Pat. No. 4,915,775, which is hereby incorporated by reference, discloses an apparatus for adjusting the initial melt level of a liquid crystal. A vertical position of the melt surface during crystal growing is calculated from a reduction rate of the melt. U.S. Pat. No. 4,350,557, which is hereby incorporated by reference, discloses an apparatus that controls the cross-sectional configuration of the crystal by first rotating the crystal and then detecting the circumference of the crystal. This apparatus does not measure or compute melt level. U.S. Pat. No. 3,998,598, which is hereby incorporated by reference, controls the growth of the crystal by regulating the pull rate of the crystal and the temperature of the melt, and by raising or lowering the crucible in accordance with the pull rate. A pyrometer aligned with the liquid-solid interface of the melt and the crystal provides a signal when the interface is out of alignment. IBM Technical Disclosure Bulletin, Vol. 27, No. 10A, "Monitoring Diameter Variations and Diameter Control Using Laser Beam and Image Processing in Czocharalski Crystal Growth," which is hereby incorporated by reference, uses a reflected laser beam to measure changes in the meniscus and to compute a corresponding diameter change. Finally, Digges, Jr. et al., which is hereby incorporated by reference discloses how optical sensing of the luminous ring can be used to indirectly measure and control the crystal diameter.

Using the conventional systems described above, the total diameter error is the sum of the orbit error, twice the melt level error and the CCD camera angle error. These errors can counteract each other such as having one error indicate a smaller than actual diameter while another indicates a larger than actual diameter. However, all the errors could also indicate a diameter that is either too small or too large. This compounding of errors is a worst case scenario, and can result in significant material loss due to oversized or undersized crystals.

SUMMARY OF THE INVENTION

An object of the invention is to provide an automatic diameter control system and method that eliminates the above-described negative effects of orbit, melt level and incorrect camera angle when measuring the diameter of a crystal. A camera may be used to measure both the diameter of the crystal and the melt level through optical recognition of the luminous ring at the crystal-melt interface.

In one embodiment, a CCD camera may be positioned such that it focuses on a full half of a circumference of the crystal as it grows. The CCD camera may use two points diametrically opposed on the single silicon crystal to measure a diameter, and a third point on the crystal closest to the camera to measure the melt level. The signals derived from the CCD camera may be used in an automatic control system to control a crucible lift rate and a crystal pull rate.

In another embodiment, two or more cameras may be used such that one camera detects one diameter point and a point on the luminous ring near the center of the crystal and another camera detects the another diameter point and the same point near the center of the crystal. This embodiment may be useful if the configuration of the grounding chamber prevents viewing all three points simultaneously with one camera. In addition, multiple cameras may increase the resolution possible since the detected areas are smaller in surface area.

Other objects, advantages and salient features of the invention will become apparent from the following detailed description taken in conjunction with the annexed drawings, which disclose preferred embodiments of the invention.

BRIEF DESCRIPTION OF THE DRAWINGS

The invention will be described in detail with reference to the following drawings, wherein like reference numerals refer to like elements and wherein.

DETAILED DESCRIPTION OF PREFERRED EMBODIMENTS

Figure 2:
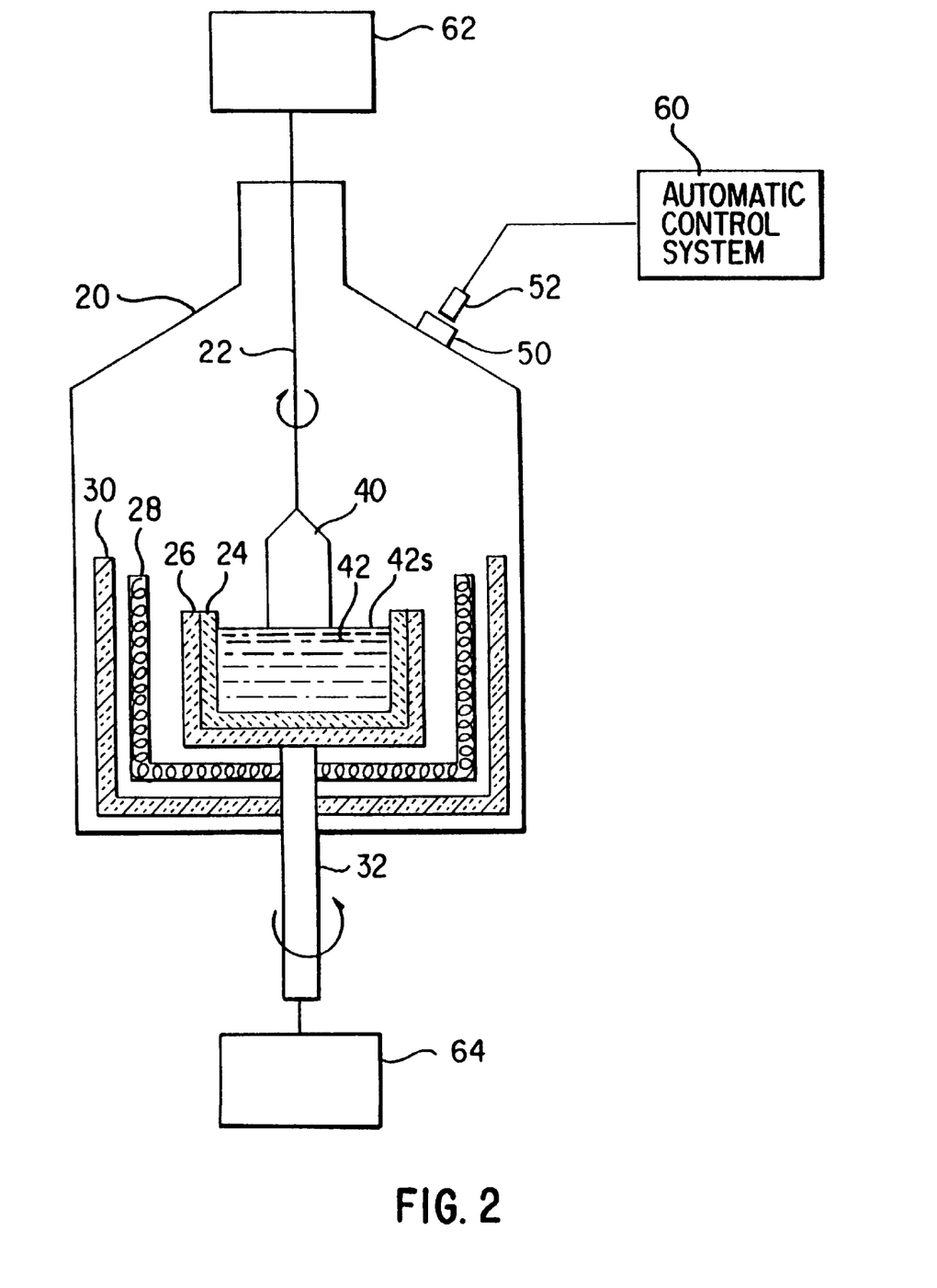
FIG. 2 is a schematic showing hardware components of an embodiment of the present invention.

FIG. 2 illustrates a diameter control system for automatic crystal growth control in a Czocharalski crystal pulling system that has been modified according to the present invention. A graphite susceptor 26 is fastened to the top of a rotatable shaft 32. A quartz crucible 24 is housed inside the graphite susceptor 26 to hold the molten silicon 42. The graphite susceptor 26 is surrounded by a heater 28, which is then surrounded by a heat insulator 30. Attached to the lower end of a rotatable wire 22, which can be raised and lowered by a motor (not shown) arranged above the molten silicon 42, is a seed crystal (not shown) used to start the growth of the crystal 40. The system is housed in a growing chamber 20. The atmosphere is purged of oxygen by, for example, use of argon gas. Attached to the growing chamber 20 is a view port 50, and a CCD camera 52. The CCD camera 52 is electronically connected to an automatic control system 60, which is used to interpret the signals produced by the CCD camera 52. The automatic control system 60 uses signals produced by the CCD camera 52 to automatically control growth parameters of the crystal such as crystal pull rate, $R_p$, and crucible lift rate, $R_l$. Also associated with the automatic control system 60 is a wire controller 62, which is used to control the pull rate $R_p$ and a lift controller 64, which is used to control the lift rate $R_l$.

Lumps of polycrystalline silicon are placed in the quartz crucible 24 and electricity is supplied to the heater 28 to obtain a melt 42 from the polycrystalline silicon. When the lower end of the seed crystal (not shown) is brought into contact with the surface 42s of the melt 42 and is then pulled up, the crystal 40 grows on the tip of the seed crystal. The growth of the crystal 40 is carried out in the chamber 20, which is purged of air by argon gas, for example.

Figure 3:
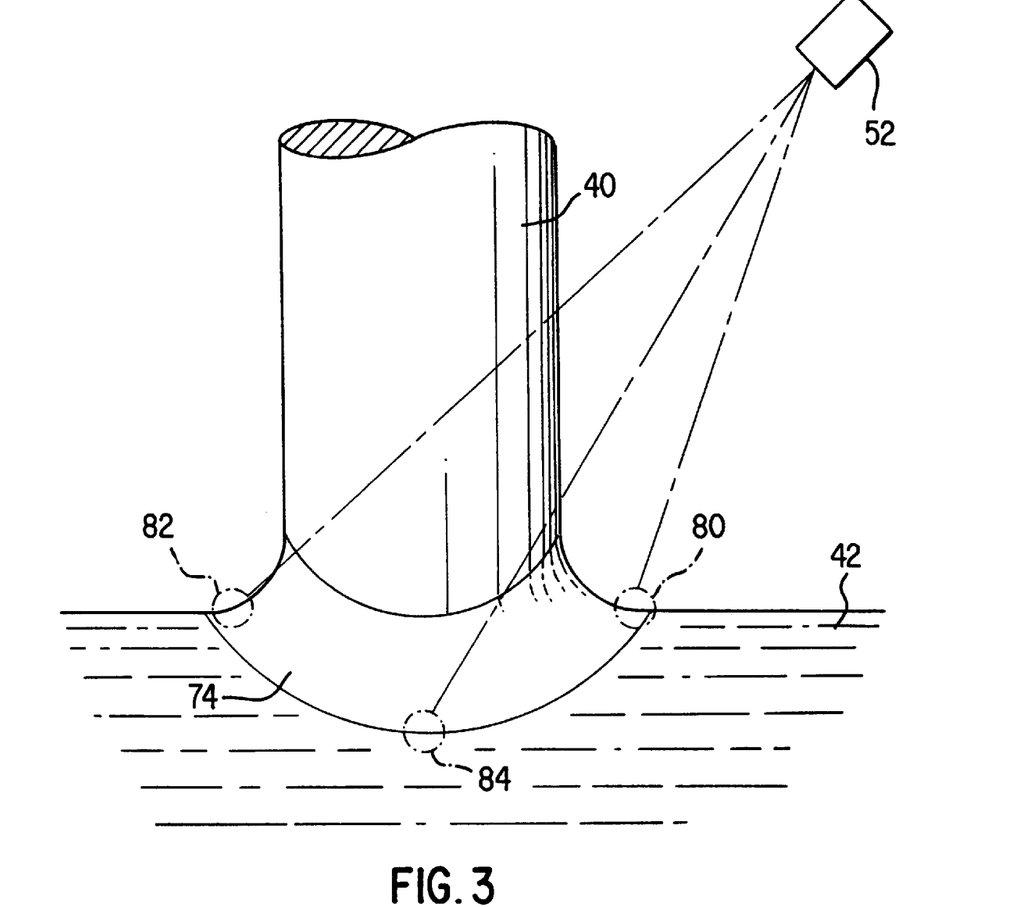
FIG. 3 shows measurement points according to the present invention.

In order to measure the diameter D of the crystal 40, the CCD camera 52, whose optical axis O is directed to the bottom of the luminous ring 74 of the melt 42, is arranged above the view port 50 provided on a shoulder of the chamber 20. As shown in FIG. 3, the CCD camera 52 measures points 80, 82 and 84 on the luminous ring 74 between the crystal 40 and the melt 42.

The CCD camera 52 outputs a composite video signal, which is supplied to the automatic control system 60, shown in FIG. 2, where it is separated into appropriate signals to control the pull rate $R_p$ of the crystal 40 and the lift rate $R_l$ or height of the crucible 24. One example of an automatic control system is disclosed in U.S. Pat. No. 5,138,179, which is hereby incorporated herein by reference.

Figure 4:
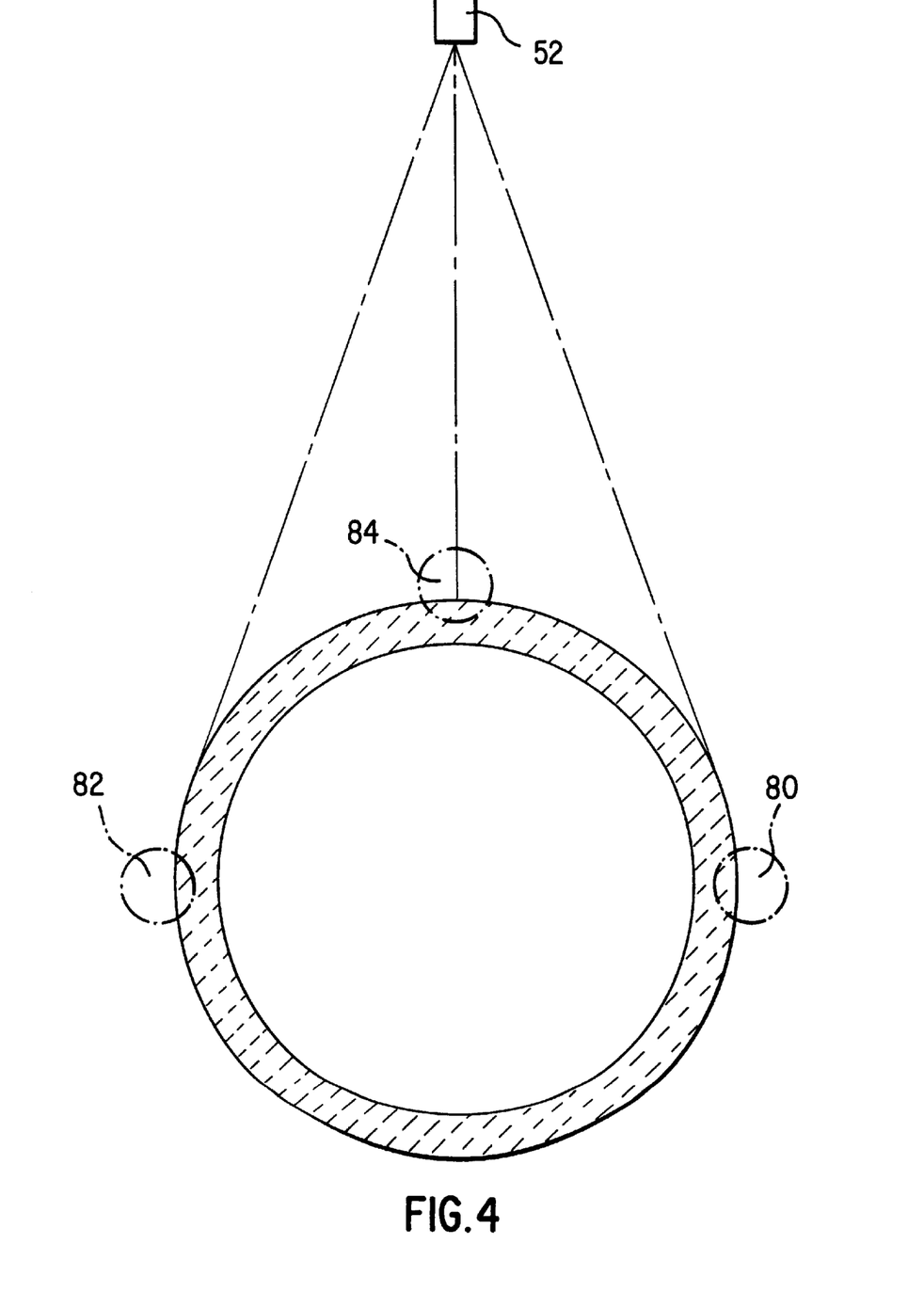
FIG. 4 shows distance measurements according to the present invention.
Figure 5:
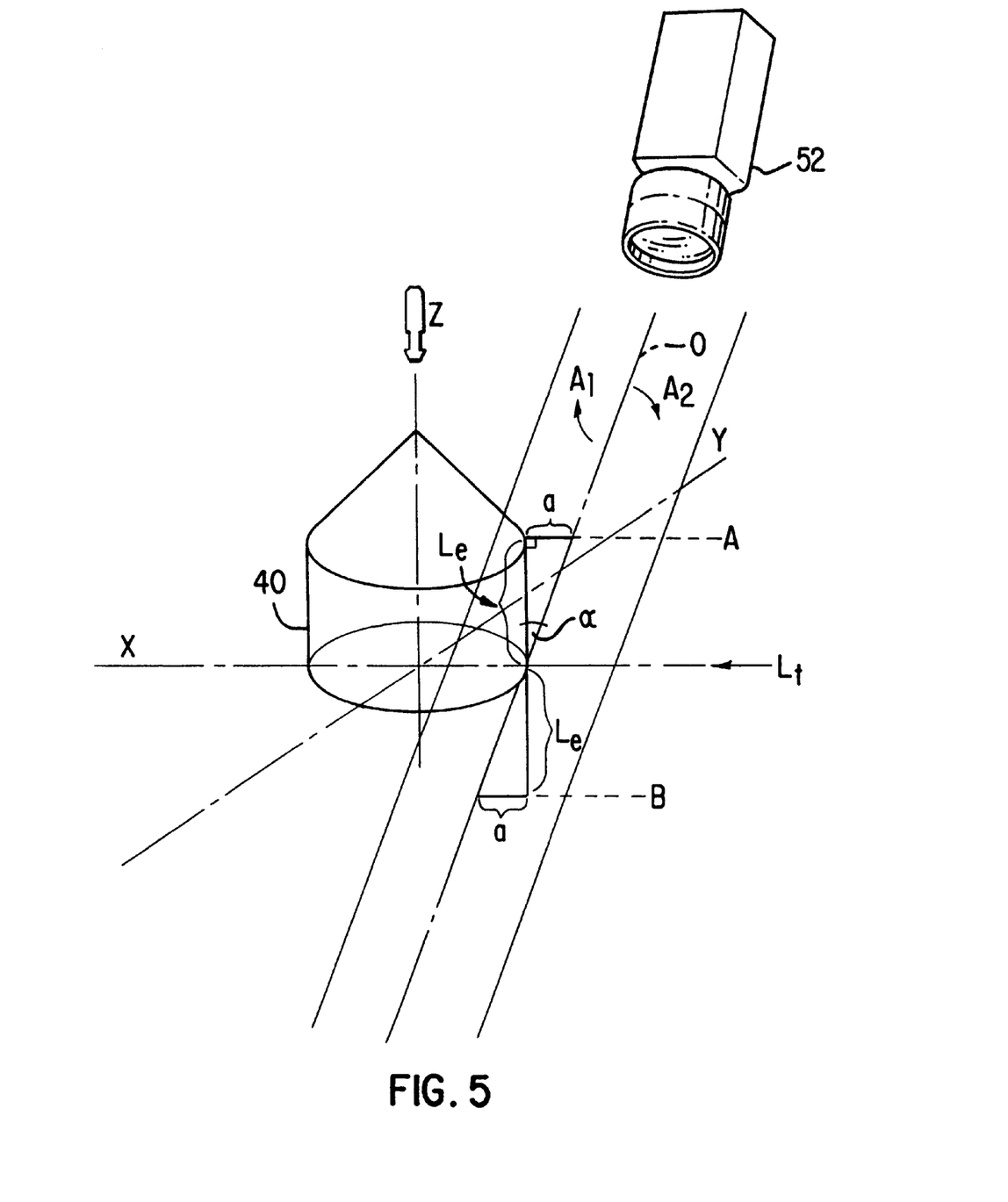
FIG. 5 is a schematic showing measurement points for computing melt level errors.

Next, the diameter error measurement according to the embodiment will be described with reference to FIGS. 4 and 5. In FIG. 4, the CCD camera 52 is arranged to image diameter measurement points 82 and 80. The optic axis O of the CCD camera 52 is focused on a center measurement point 84, which corresponds to a point on the luminous ring 74 at the outside of the crystal 40 when the crystal 40 is at its target diameter $D_t$. That is, the optic axis o of the CCD camera 52 is aimed at the exact target center of the crystal 40. FIG. 5 is a schematic representation showing the measurements of the crystal diameter. The CCD camera 52 takes still images of the growing crystal 40 at specific intervals, for example once every second. The CCD camera 52 is tilted to focus on a target melt level $L_t$ as shown in FIG. 5. In particular, the optic axis O of the CCD camera 52 is aligned to intersect the target melt level $L_t$ at the point corresponding to the crystal target diameter Dt. The CCD camera 52 is tilted to an oblique angle α, for example 22.5 degrees.

The automatic control system 60 counts the number of pixels between the diameter measurement points 80 and 82, as shown in FIG. 4. Specifically, the automatic control system 60 counts the number of pixels between the left measurement point 80 and the right measurement point 82. The automatic control system 60 is calibrated so that each pixel represents a finite distance along the crystal diameter D. For example, each additional pixel that is imaged, and that represents part of the crystal 40, is equal to 0.05 mm of diameter. Thus, as the crystal 40 grows in diameter, the number of pixels that represent an image of the crystal 40 increases until the target diameter $D_t$ is reached. Thereafter, the number of pixels that indicate part of the crystal diameter increases, decreases, or remains constant, depending on conditions in the crucible 24 and on the pull rate $R_p$ of the wire 22.

The diameter imaged, or measured, by the CCD camera 52 is converted to a voltage $V_d$ in the automatic control system 60. The voltage $V_d$ is then compared to a reference voltage $V_r$ which corresponds to the crystal target diameter $D_t$. If the measured diameter $D_m$ is less than the target diameter $D_t$, the pull rate $R_p$ of the wire 22 is decreased. If the measured diameter $D_m$ is greater than the target diameter $D_t$, the pull rate $R_p$ of the wire 22 is increased. To increase or decrease the pull rate $R_p$ of the wire 22, the automatic control system 60 sends a control system based on the difference between $V_d$ and $V_t$ to the wire controller 62 connected to the wire 22. The wire controller 62 then controls the wire pull motor (not shown) to increase or decrease the pull rate $R_p$ as appropriate. The pull rate $R_p$ of the wire 22 varies between the minimum value $R_{p1}$ and a maximum value $R_{p2}$.

When the crystal growing process begins, the actual crystal diameter $D_a$ is much smaller than the target diameter $D_t$. Accordingly, the pull rate $R_p$ of the wire 22 is at a minimum value of $R_{p1}$. As a result, the actual diameter $D_a$ of the crystal 40 begins to increase. The result is a characteristic cone shape that forms on the top portion of the crystal 40, as shown in FIG. 5. The top portion is waste material and is cut off during initial processing of the crystal 40.

Once the target diameter $D_t$ is reached, the measured diameter $D_m$, the actual diameter $D_a$, and the target diameter $D_t$ are all equal. In this situation, the automatic control system 60 does not generate an error signal and the pull rate $R_p$ remains constant. If the actual diameter $D_a$ increases, the CCD camera 52 images a diameter $D_m$ in excess of the target diameter $D_t$. In this case, the automatic control system 60 computes a negative error $-D_e$. The automatic control system 60 then sends a decrease command to the wire controller 62 to slow the pull rate $R_p$ of the wire 22. If the actual diameter $D_a$ decreases, the CCD camera 52 images a diameter $D_m$ that is smaller than the target diameter $D_t$. In this case, the automatic control system 60 computes a positive error $+D_e$. The automatic control system 60 then sends an increase command to the wire controller 62 to increase the pull rate $R_p$ of the wire 22.

Because the CCD camera 52 images diameter measurement points 80 and 82 and center measurement point 84, any error associated with orbit is eliminated. That is, if there is any orbit, one radius will appear to increase but the other will appear to decrease. The net effect on the diameter calculation will be zero.

Next, the error signal associated with the melt level L will be described. The target diameter $D_t$ is also used by the automatic control system 60 to compute a foreshortened diameter DF. Referring to FIG. 5, an isometric view of the crystal 40 is shown along with the CCD camera 52. Because the CCD camera 52 is inclined by the oblique angle α from a center of rotation Z of the crystal 40, the CCD camera 52 will "see" a "foreshortened" diameter DF in the X-direction and the "real" diameter D in the Y-direction. The foreshortened diameter DF results from the CCD camera 52 being tilted through the oblique angle α, making the circular cross-section of the crystal 40 appear to be elliptical. Thus, the foreshortened diameter DF is related to the real diameter D by:

$$DF = D \times \cos\alpha \qquad \text{Equation 2}$$

The optic axis O of the CCD camera 52 is aimed at the exact target center 84 of the crystal 40, when the crystal 40 is at its target diameter $D_t$. Ideally, the melt level L remains at its target value $L_t$ during the crystal growth process. If, however, the melt level L is not at its target value $L_t$, the automatic control system 60 detects this error, and produces a control signal to raise or lower the crucible 24. In FIG. 5, point A shows the actual melt level $L_{a1}$ higher than the target melt level $L_t$. Because the CCD camera 52 sees the luminous ring 74 at a point higher than the target value, $L_t$, the CCD camera 52 perceives the foreshortened diameter DF to be larger by the factor a than the actual foreshortened diameter $DF_a$. Point B shows the actual melt level $L_{a2}$ lower than the target melt level $L_t$. Because the CCD camera 52 sees the luminous ring 74 at a point lower than the target value, $L_t$, the CCD camera 52 perceives the foreshortened diameter DF to be smaller by the factor a than the actual foreshortened diameter $DF_a$. The melt level error $L_e$ is then related to a perceived diameter error by:

$$a = L_e \times \tan\alpha \qquad \text{Equation 3}$$

where,
a = perceived foreshortened diameter error,
$L_e$ = melt level error,
α = camera angle.

According to the above, the difference in target foreshortened diameter $DF_t$ and actual foreshortened diameter $Df_a$ is related to the melt level error $L_e$. The melt level error $L_e$ will be a positive or negative value, depending on whether the actual melt level $L_a$ is above or below the target value $L_t$. When the melt level error $L_e$ is detected by the automatic control system 60, a control signal is developed and sent to the crucible lift controller 64 to raise or lower the crucible 24.

To detect melt level error $L_e$, the automatic control system 60 interprets pixel detection of the luminous ring 74 in the following manner. Note the arrows A1 and A2. The arrow A1 points in a clockwise direction, or above the camera optic axis O. The arrow A2 points in a counter clockwise direction or below the camera optic axis O. If the actual target melt level $L_a$ is above the target melt level $L_t$, pixels above the optic axis O, in the direction of the arrow A1, will image the luminous ring 74. The automatic control system 60 is calibrated such that if a pixel above the optic axis O images the luminous ring 74, then the automatic control system 60 can compute the distance from that pixel to the optic axis O. Then, based on the camera angle α, the perceived foreshortened diameter error a is computed. The perceived foreshortened diameter error a is then used in the above equation to compute the melt level error $L_e$. Similarly, if the melt level L is lower than the target melt level, $L_t$, a pixel below the optic axis O in the direction shown by the arrow A2 will image the luminous ring 74. By a similar process as above, the automatic control system 60 then computes the melt level error $L_e$.

When diameter errors and melt level errors are detected, the automatic control system 60 generates appropriate control signals to adjust the pull rate $R_p$ and the crucible height or the lift rate $R_l$, respectively. The automatic control system 60 may include various feedback loops or adjustment limits so that the pull rate $R_p$ and the height or the lift rate $R_l$ are not continuously varied. This is particularly important since the imaging increment may be short (e.g., once per second) and the rate of crystal growth slow. In other words, a minor change in pull rate $R_p$ will not be reflected in the crystal diameter D for many image increments. Therefore, the automatic control system 60 may produce a control signal to increase pull rate $R_p$, for example, and then prevent further increases in the pull rate $R_p$ until a specified time has elapsed in which the results of the increase can be reflected in the crystal diameter D (in this example to decrease crystal diameter D).

Figure 6:
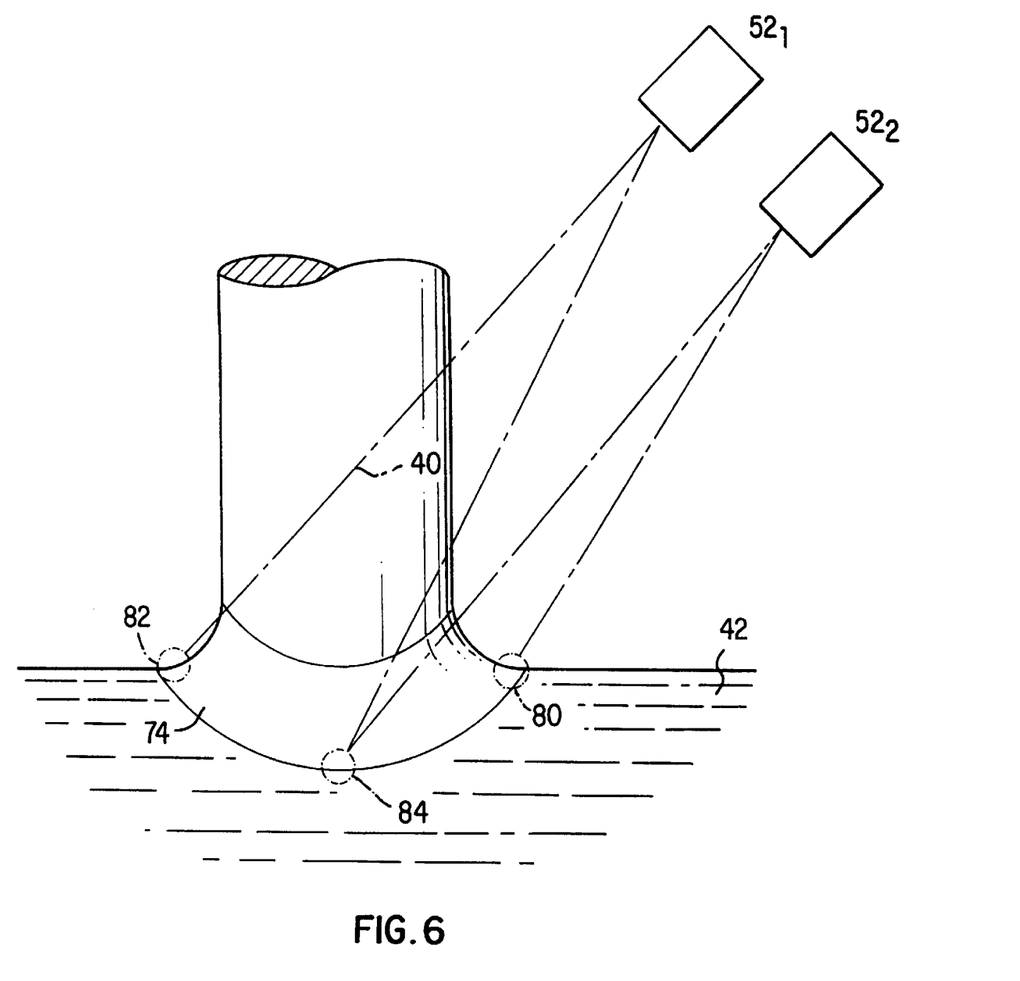
FIG. 6 shows camera arrangement of another embodiment of the present invention.

In another embodiment shown in FIG. 6, the automatic control system can incorporate two or more CCD cameras $52_1$—$52_i$ rather than using a single CCD camera 52. For example, a left CCD camera $52_1$ and a right CCD camera $52_2$ can be positioned in the camera housing. The optic axis $O_1$ of the left CCD camera $52_1$ is centered approximately on the mid point between the center measurement point 84 and the left measurement point 80. The left CCD camera $52_1$ is positioned so that approximately the left quarter of the crystal 40 is imaged. The optic axis $O_2$ of the right CCD camera $52_2$ is centered approximately on the mid point between the center measurement point 84 and the right measurement point 82. The right CCD camera $52_2$ is also positioned so that approximately the right quarter of the crystal 40 is imaged. The left and the right CCD cameras $52_1$ and $52_2$ are further arranged so that there is a slight overlap between their fields of view near a crystal center line running vertically through the center point 84.

Figure 7:
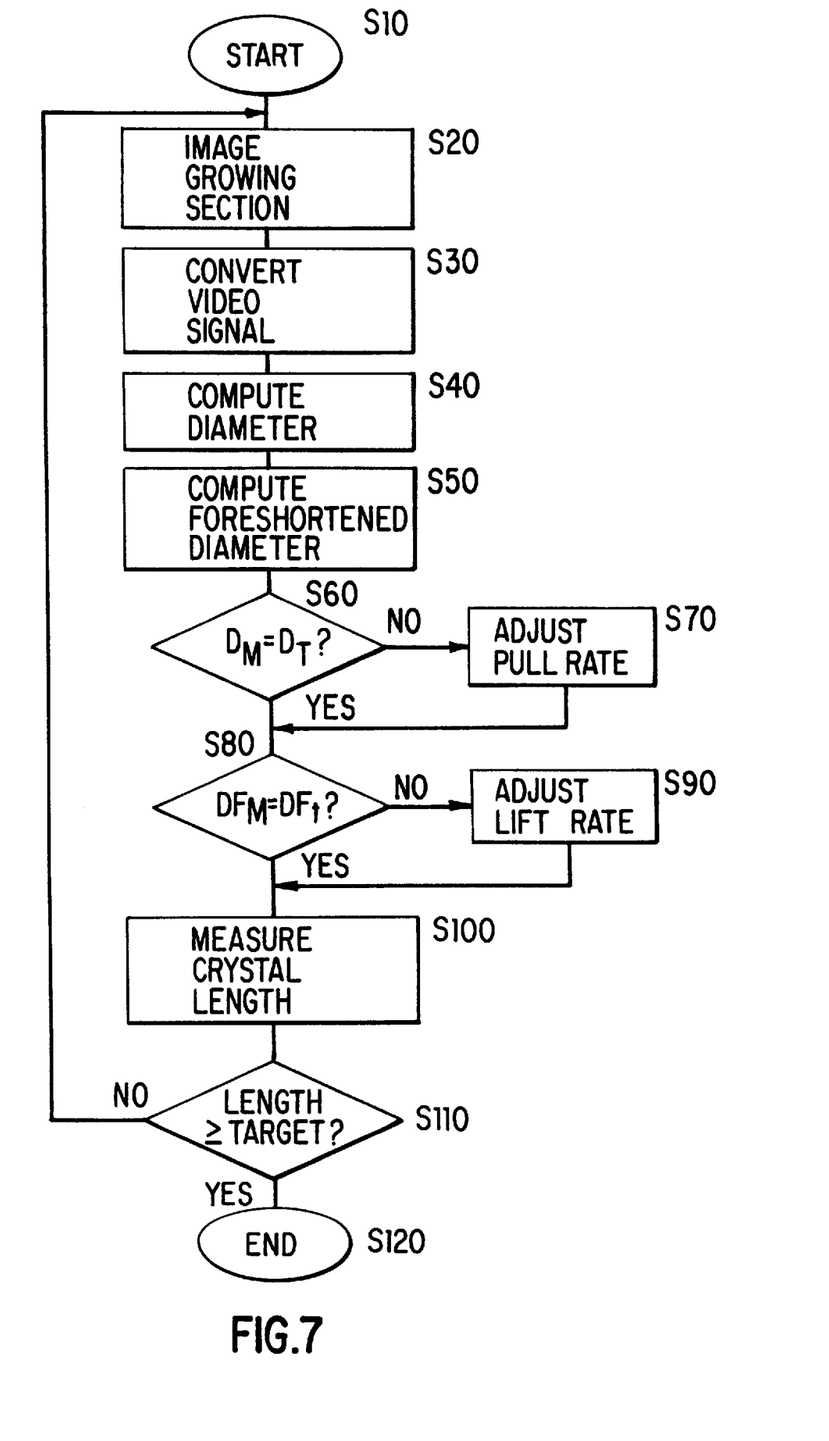
FIG. 7 is a flow chart showing the control program for controlling crystal growth according to the present invention.

Operation of the automatic control system 60 according to one embodiment with a single CCD camera 52 will now be described with reference to FIG. 7. Prior to the start of the automatic control system 60, the CCD camera 52 is checked to ensure that its optic axis O coincides with the target melt level $L_t$ and the target crystal diameter $D_t$. First, the distance from the bottom of the crucible 24 to the target melt level $L_t$ is measured. Then, based on the target crystal diameter $D_t$, the optic axis O is verified to be centered on an intercept point defined by the melt level and the target foreshortened diameter $DF_t$. The automatic control system 60 stores the values to the target melt level $L_t$, the target diameter $D_t$ and the target foreshortened diameter $DF_t$.

The crucible 24 is then loaded with polycrystalline silicon and the heater 28 is energized to form the melt 42. The seed crystal, suspended from the wire 22, is lowered into the melt 42. When the desired melt conditions are met, the automatic control system 60 takes over control of the crystal growth.

For example, at step S10, the automatic control system 60 begins to control the crystal growth. The control program then advances to step S20 where the CCD camera 52 images the crystal 40. The control program then advances to step S30. In step S30, the automatic control system 60 converts the image into digital signals. The control program then advances to step S40 where the automatic control system 60 computes actual crystal diameter $D_a$ by counting the number of pixels from the left diameter point 80 to the right diameter point 82. The value is multiplied by a pixel-to-length conversion factor to produce the measured diameter $D_m$. The control program then advances to step S50.

In step S50, the automatic control system 60 computes the measured foreshortened diameter $DF_m$ by counting the number of pixels imaged from the crystal center axis Z to the intercept point of the actual melt level $L_a$. That is, the automatic control system 60 measures the number of pixels that represent the crystal 40 from the Z-axis to the luminous ring 74. The control program then advances to step S60 where the automatic control system 60 compares the measured crystal diameter $D_m$ from step S40 to the target diameter $D_t$. If the measured crystal diameter $D_m$ equals the target diameter $D_t$ within an allowed tolerance, the control program advances to step S80. Otherwise the control program advances to step S70 where the automatic control system 60 generates an error signal $D_e$ corresponding to the amount and direction of diameter error. If the measured diameter $D_m$ is less than the target diameter $D_t$, the automatic control system 60 generates a positive error signal +$D_e$. The error signal +$D_e$ is then applied to the wire controller 62 to slow the pull rate $R_p$. If the measured diameter $D_m$ is more than the target diameter $D_t$, the automatic control system 60 generates a negative error signal –$D_e$. The error signal –$D_e$ is then applied to the wire controller 62 to increase the pull rate $R_p$. The control program then advances to step S80.

In step S80, the automatic control system 60 determines if the measured foreshortened diameter $DF_m$ equals the target foreshortened diameter $DF_t$. If it does, the control program advances to step S100. If the measured foreshortened diameter $DF_m$ does not equal the target foreshortened diameter $DF_t$, the control program advances to step S90 where the automatic control system 60 develops a control signal to adjust the crucible height. If the measured foreshortened diameter $DF_m$ is greater than the target foreshortened diameter $DF_t$, indicating the melt level L is too high, the control signal acts to lower the crucible 24. If the measured foreshortened diameter $DF_m$ is less than the target foreshortened diameter $DF_t$, indicating the melt level L is too low, the control signal acts to raise the crucible 24. The control program then advances to step S100 where the automatic control system 60 measures the length of the crystal 40. The control program then advances to step S110 where the automatic control system 60 compares the measured crystal length to the target length. If the measured crystal length equals or exceeds the target crystal length, the control program advances to step S120 where the crystal growth process ends. Otherwise, the control program returns to step S20.

In the embodiment with two or more CCD cameras, the process is generally the same as the above except that the images captured by the individual CCD cameras are combined in the automatic control system 60 to provide an indication of diameter and melt level error.

Other aspects of the embodiments of the automatic control system 60 can include a provision to control a hydraulic lift mechanism for the crucible, a hydraulic pull system for the crystal 90, a magnetic field system for centering the crystal 40 in the melt 42, and a melt temperature control system.

Those skilled in art will appreciate that other embodiments of the apparatus and method for automatically controlling crystal growth other than those shown in Figures are possible without deviating from the scope of the invention as defined in the following claims.

What is claimed is:

1. A method for automatically controlling growth of a crystal being pulled from a crucible, the method comprising the steps of:

detecting first, second and center areas on a circumference of the crystal;

computing an actual crystal diameter based on a distance between first and second detected areas;

comparing the actual crystal diameter with a target crystal diameter;

adjusting a pull rate of the crystal based on the comparison between the actual crystal diameter and the target crystal diameter;

determining a melt level error based on a center detected area between the first and second areas; and adjusting a melt level based on the melt level error.

2. The method of claim 1, wherein the step of determining a melt level error comprises:

determining a distance between the center area and an optic axis; and determining the melt level error based on the distance between the center area and the optic axis and a camera angle.

3. The method of claim 1, wherein the determining step comprises the steps of:

computing a perceived foreshortened crystal diameter;

computing an expected foreshortened crystal diameter based on the actual crystal diameter;

computing a diameter error based on the perceived foreshortened crystal diameter and the expected foreshortened crystal diameter; and computing the melt level error based on the diameter error.

4. The method of claim 3, wherein the three areas are in a luminous ring in a growing section of the crystal, the luminous ring being substantially coincident with the circumference of the crystal, the three areas comprising a first area, a second area and a center area, the center area being approximately midway between the first area and the second area.

5. The method of claim 4, wherein the three areas are detected by at least one camera mounted at an angle with respect to a centerline of the crystal.

6. The method of claim 5, wherein the step of computing the expected foreshortened crystal diameter comprises multiplying the actual crystal diameter by the cosine of the angle.

7. The method of claim 5, wherein the melt level error equals the diameter error divided by the tangent of the angle.

8. The method of claim 7, wherein the melt level adjusting step comprises adjusting a height of a crucible based on the melt level error, the crucible containing a liquid material used to grow the crystal.

9. The method of claim 4, wherein the three areas are detected by a first camera and a second camera, the first camera detecting said first area and said center area, and the second camera detecting said second area and the center area.

10. A method for automatically controlling growth of a crystal being pulled from a crucible, the method comprising the steps of:

computing a first crystal diameter;

comparing the first crystal diameter to a target crystal diameter;

adjusting a crystal pull rate based on the comparison of the first crystal diameter to the target crystal diameter;

computing a diameter error based on at least the first crystal diameter;

computing a melt level error based on the diameter error; and adjusting a melt level by adjusting a height of the crucible based on the melt level error.

11. The method of claim 10, wherein the first crystal diameter is computed by measuring a distance between a first area and a second area on a circumference of the crystal.

12. The method of claim 11, wherein the distance is measured using at least one camera mounted at an angle with respect to a vertical line running longitudinally through the center of the crystal.

13. The method of claim 12, wherein the step of computing the diameter error comprises multiplying the first crystal diameter by the cosine of the angle.

14. The method of claim 13, wherein the melt level error is computed by dividing the diameter error by the tangent of the angle.

15. The method of claim 14, wherein the camera images a growing section of the crystal and supplies a video signal.

16. The method of claim 15, wherein the video signal is converted to a digital signal by binary-coding the video signal.

17. The method of claim 16, wherein the first and the second areas and a center area are imaged in a luminous ring in a growing section of the crystal.

18. The method of claim 17, wherein a first and a second camera are used, the first camera imaging the first area and the center area and the second camera imaging the second area and the center area.

* * * * *